United States Patent [19]

Bates et al.

[11] Patent Number: 4,553,266

[45] Date of Patent: Nov. 12, 1985

[54] R.F. CIRCUIT ARRANGEMENT

[75] Inventors: Robert N. Bates, Redhill; Philip M. Ballard, Crawley, both of England

[73] Assignee: U.S. Philips Corporation, New York, N.Y.

[21] Appl. No.: 521,501

[22] Filed: Aug. 8, 1983

[30] Foreign Application Priority Data

Aug. 27, 1982 [GB] United Kingdom ................ 8224612

[51] Int. Cl.$^4$ .......................... H04B 1/16; H04B 1/26
[52] U.S. Cl. .................................... 455/327; 455/328; 455/330
[58] Field of Search ............... 455/325, 326, 327, 328, 455/330

[56] References Cited

U.S. PATENT DOCUMENTS 3,939,430 2/1976 Dickens et al. ...................... 455/327
4,032,849 6/1977 Gysel et al. .......................... 455/325

Primary Examiner—Marc E. Bookbinder

Attorney, Agent, or Firm—Robert J. Kraus

[57] ABSTRACT

An R.F. circuit with at least one R.F. transmission line including a strip conductor (15) and a ground plane (13) on an insulating substrate (3) and having two diodes (24, 25) respectively D.C.-connected to two portions (38,39) of the ground plane (13). The two portions are mutually D.C.-isolated by a slot (37) to enable the diodes (24, 25) to be biased. The substrate (3) is mounted in a housing (1, 2) of conductive material, and the two portions (38, 39) of the ground plane (13) are mutually R.F.-coupled via the conductive material. One of the portions (39) is electrically-connected to an adjacent housing member (2) and the other portion (38) is separated therefrom by a thin insulating layer. The slot (37) inhibits coupling of R.F. energy out of the circuit into the slot (37), suitably being very narrow, e.g. 20 μm, so as to form a further transmission line with a very low characteristic impedance and also to have a high attenuation along its length for operation at mm-wavelengths.

6 Claims, 6 Drawing Figures

R.F. CIRCUIT ARRANGEMENT

BACKGROUND OF THE INVENTION

The invention relates to an R.F. circuit arrangement comprising insulating substrate means, at least one R.F. transmission line comprising a ground plane on the substrate means, and two diodes respectively D.C.-connected to two portions of the ground plane. For D.C.-biasing of the diodes, the circuit arrangement further comprises slot means in the ground plane to mutually D.C.-isolate the two portions of the ground plane.

Such an R.F. circuit arrangement is known from U.S. Pat. No. 3 939 430. This patent discloses a single-balanced mixer the R.F. circuit of which includes three transmission lines utilizing a conducting film on a first major surface of a dielectric substrate, namely a slot line, a coplanar line (sometimes known as a coplanar waveguide), and a microstrip line. The conducting film forms a ground plane in which the slot line is defined, and forms both the central conductor and the outer, ground conductors of the coplanar line, the elongate central conductor being separated by a circumferential gap from the transversely-opposed ground conductors. The conducting film also forms the ground plane of the microstrip line which further comprises a strip conductor on the other major surface of the substrate. One end of the slot line is coupled to one end of the coplanar line, the slot and gap of the respective lines together forming a continuous conductor-free region. The other end of the coplanar line is coupled to one end of the microstrip line, the central conductor of the coplanar line being connected by a conductive pin extending through the substrate to the strip conductor of the microstrip line. At the junction of the slot line and the coplanar line, two diodes are connected in opposite electrical polarities between the central conductor of the coplanar line and, respectively, two regions of the slot line ground plane lying respectively on opposite sides of the slot. This junction arrangement operates as a 180° hybrid junction (see also, for example, U.S. Pat. Nos. 3 678 395 and 4 032 849, and the paper "A 26.5-to-40 GHz Planar Balanced Mixer" by U. H. Gysel, Proceedings of the 5th European Microwave Conference, September 1975, pages 491–495).

In operation, a received R.F. signal is supplied to the junction by the slot line, while the microstrip line and the coplanar line serve to supply a local oscillator (L.O.) signal to and extract an intermediate frequency (I.F.) signal from the junction. A constructed embodiment described in the patent operated with an R.F. signal frequency of 9.4 GHz and an L.O. signal frequency of 7.8 GHz, giving an I.F. signal frequency of 1.6 GHz.

To permit the diodes to be D.C.-biased and hence to reduce the power of the L.O. signal with which a particular value of conversion loss is obtainable, a respective portion of each of the two regions of the ground plane that lie on opposites sides of the slot line (the portions including the connections to the diodes) is isolated from the remainder of the ground plane by contiguous slots which extend from the slot line to the coplanar line so as to define therewith a rectangular bias pad (see FIG. 6 of U.S. Pat. No. 3,939,430). Since the diodes are connected in opposite electrical polarities, they appear in series between the two bias pads and can thus be forward biased by the application of a suitable direct voltage between the pads.

To provide a path between each of the bias pads and the respective adjacent ground plane region for the received R.F. signal and the L.O. and I.F. signals, a plurality of beam-leaded coupling capacitors are connected therebetween. However, currently-available commercial capacitors of this kind with suitable capacitances have a significant inductance which makes them unsuitable for use at frequencies above 5–10 GHz since they can then present a substantial impedance in the paths of these signals and/or can exhibit resonant effects. Furthermore, the additional slots provided to D.C.-isolate the bias pads form a secondary transmission line, and in order to inhibit the coupling of R.F. energy out of the slot and coplanar lines into this secondary line, it is important for respective capacitors to be accurately positioned across the secondary line immediately adjacent the junctions of that further line with the slot line and with the coplanar line, as depicted in FIG. 6 of U.S. Pat. No. 3,939,430. Provided that each capacitor presents a low impedance across the secondary line, the line will reflect the majority of the R.F. energy that would otherwise be coupled into it. However, if either capacitor is not correctly positioned (in which case a length of the further line can act as a stub) or if either capacitor does not present a low impedance (in which case R.F. energy can propagate along the further line past the capacitor), the further line can be coupled to a significant extent to the main R.F. circuit and can cause undesired effects therein.

It may be noted that a somewhat similar circuit arrangement to that mentioned above is disclosed in U.S. Pat. No. 4 118 670.

SUMMARY OF THE INVENTION

It is an object of the invention to alleviate one or both of the above-mentioned disadvantages, and to provide an R.F. circuit arrangement which may be particularly suitable for use at very high frequencies.

According to a first aspect of the invention, an R.F. circuit arrangement as set forth in the opening paragraph is characterised in that the circuit arrangement further comprises a housing for the substrate, the housing comprising conductive material, and in that two portions of a ground plane utilized for applying diode D.C. bias are mutually R.F.-coupled by capacitive coupling via the conductive material.

Suitably, one of the portions of the ground plane is conductively connected to the conductive material and the other portion is D.C.-isolated therefrom and capacitively coupled therewith over at least the majority of the portion. This may readily be achieved when for example the substrate is mounted in an E-plane of a waveguide in the housing, the area of the other portion that extends in the housing outside the waveguide being greater than the area of the other portion within the waveguide. Such an embodiment is particularly suitable for operation at relatively high radio frequencies, for example above 18 GHz, and especially at millimeter-wave frequencies, for example 60–90 GHz or higher.

According to a second aspect of the invention, an R.F. circuit arrangement as set forth in the opening paragraph, which arrangement may embody the first aspect of the invention, is characterised in that the slot means substantially inhibits the coupling of R.F. energy out of the at least one transmission line into the slot means. This aspect of the invention is based on the recognition that the slot means per se may be so configured or arranged so as to inhibit the coupling of R.F. energy, and that it is therefore not necessary to rely on accurate positioning of capacitors across the slot means. While such accurate positioning may be difficult and labour-intensive and may not be reproducible from one circuit to another, slot means may readily and reproducibly be accurately defined by available technology.

In an embodiment of the second aspect of the invention wherein the slot means forms a secondary R.F. transmission line adjacent a primary R.F. transmission line, the slot means may where it is adjacent the primary line present thereto an impedance differing greatly from the local characteristic impedance of the primary line. As a result, there will be a large mismatch between the primary line and the secondary line. Suitably, where the slot means is adjacent the primary line, the secondary transmission line formed by the slot means has a characteristic impedance much less than the local characteristic impedance. Such a secondary transmission line can be formed by a slot substantially narrower than slots which typically are used as transmission lines and which typically have characteristic impedances of 100–200 ohms; the width of such a slot line on a substrate having a typical dielectric constant of 2.22 is in the region of 150 $\mu$m, whereas the width of a slot forming a secondary transmission line may for example be about 20 $\mu$m. Narrow slot means provide the additional advantage of increasing the capacitive coupling between the two portions of the ground plane directly across the slot. For this purpose, the length of the slot is preferably several wavelengths in the frequency band of operation of the R.F. circuit arrangement, for example 3 wavelengths or more.

The secondary transmission line has a substantial attenuation along the length thereof in the frequency band of operation of the R.F. circuit arrangement if the secondary line has a termination (e.g. an open circuit) which is not matched to its characteristic impedance. The substantial attenuation can result in the secondary line having a high return loss and consequently nevertheless presenting an impedance which approximates its characteristic impedance. Furthermore, the substantial dissipation of any R.F. energy that is coupled into the secondary transmission line will tend to inhibit undesired effects which could result from such energy being coupled back into the primary transmission line. Substantial attenuation may readily be obtained, especially when the frequency band of operation is high, e.g. 60–90 GHz, by making the slot means narrow. It has been found that at such frequencies the attenuation per wavelength along the line increases rapidly with decreasing slot width for fairly small widths and particularly at high frequencies, can reach high levels.

In an embodiment of the invention wherein the substrate means have two opposed major surfaces, wherein the ground plane is on a first of the major surfaces, and wherein the primary transmission line is a microstrip line further comprising a strip conductor on the second major surface, the slot means is substantially juxtaposed with the strip conductor. This results in coupling between the slot means and the microstrip line being very low, while providing good direct coupling between the strip conductor and both portions of the ground plane of the microstrip line. To minimize the effect on the microstrip line of the presence of the slot means, the slot means may be longitudinally aligned centrally of the strip conductor. In an arrangement wherein the diodes are spaced longitudinally of the strip conductor from an end thereof, the two portions may extend along the strip conductor on transversely opposite sides thereof and beyond the end in the directions of the respective diodes. This can help to provide good, balanced coupling between the microstrip line and the diodes. In an embodiment wherein a second R.F. transmission line is coupled to the microstrip line and comprises conductors on one of the major surfaces, the conductors being separated by a gap, and wherein in operation an electric field of R.F. energy propagating along the second transmission line extends between said conductors across the gap:

(a) The conductors may be on the second major surface of the substrate means whereby said gap is on the opposite major surface of the substrate means to the slot means. This can alleviate difficulties, such as undesired coupling, that may occur at a junction of a gap between conductors on said first major surface and slot means on the same surface.

(b) The two diodes may be on the second major surface of the substrate means and be respectively D.C.-connected to said two portions of the ground plane by conductive connection means extending through the substrate means from the first to the second major surface. This can improve the coupling between the diodes and the microstrip line.

BRIEF DESCRIPTION OF THE DRAWING

Embodiments of the invention will now be described, by way of example, with reference to the diagrammatic drawing, in which.

DESCRIPTION OF THE PREFERRED EMBODIMENT

Figure 1:
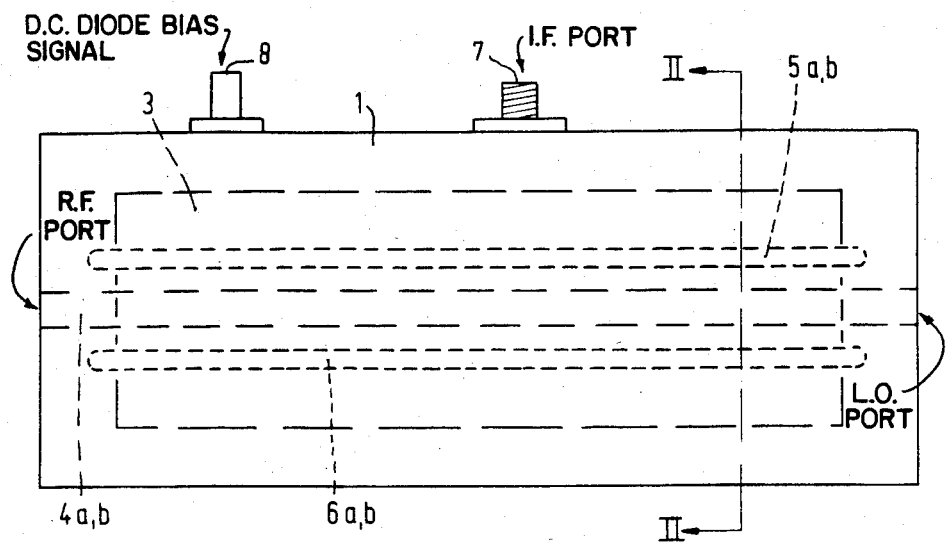
FIG. 1 is a side view of an R.F. mixer embodying the invention, the Figure showing a housing of the mixer and indicating the disposition therein of cavities and of a substrate.
Figure 2:
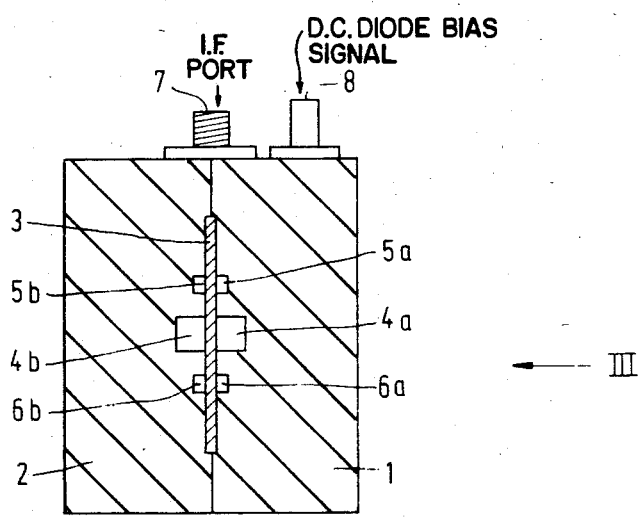
FIG. 2 is a transverse cross-sectional view on the line II—II in FIG. 1, also showing the disposition of the cavities and of the substrate.

Referring to FIGS. 1 and 2, the R.F. mixer comprises two metal housing members, 1 and 2, and an insulating substrate 3 having a conductive layer on each of its two opposed major surfaces. The housing members 1 and 2 have a pair of opposed channels 4a, 4b formed in them, so that when they are secured together (by means not shown) with the substrate 3 between them, as shown in FIG. 2, the channels form a rectangular waveguide cavity in a central longitudinal plane of which the substrate is disposed, parallel to the narrow walls of the waveguide, i.e. substantially in the plane of the maximum electric field of the fundamental $TE_{10}$ mode in the waveguide. (For clarity, the thickness of the substrate has been exaggerated in FIG. 2.) As indicated in FIG. 1, the substrate extends through most of the length of the housing, terminating a short distance from each end.

The housing members 1 and 2 have two further pairs of opposed channels 5a, 5b and 6a, 6b, respectively. These channels extend parallel to the channels 4a, 4b over the whole length of the substrate, terminating beyond the ends thereof near each end of the housing so as to form closed cavities above and below the waveguide. They will be further described below.

In operation, an R.F. input signal and an L.O. signal are respectively supplied to opposite ends of the mixer (the left and right ends respectively in the relevant Figures), and an I.F. signal is extracted at a coaxial connector 7. A direct voltage for biasing diodes in the mixer is applied to a connector 8.

Figure 3A:
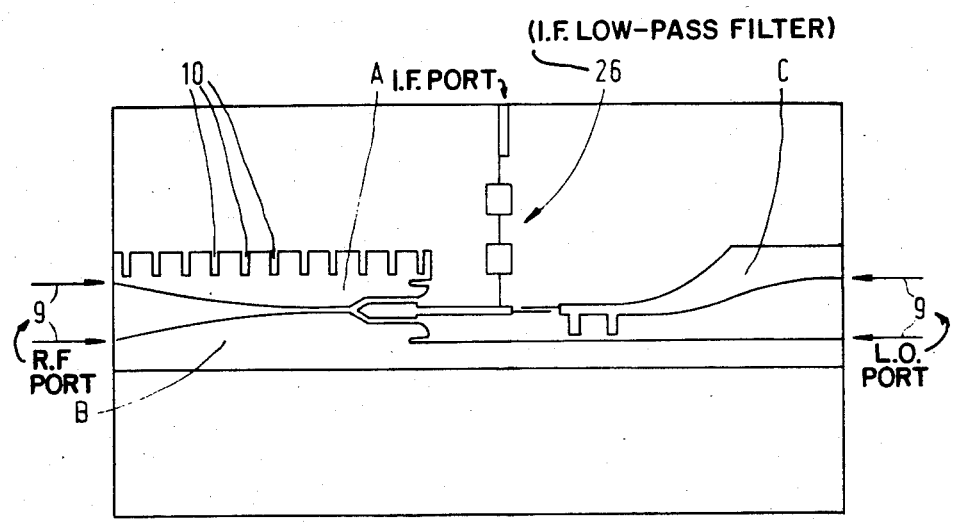
FIGS. 3A and 3B are schematic plan views of the whole substrate showing respectively the conductive layer patterns on the front and rear surfaces, viewed from the side shown in FIG. 1 and in the direction indicated by the arrow III in FIG. 2.
Figure 3B:
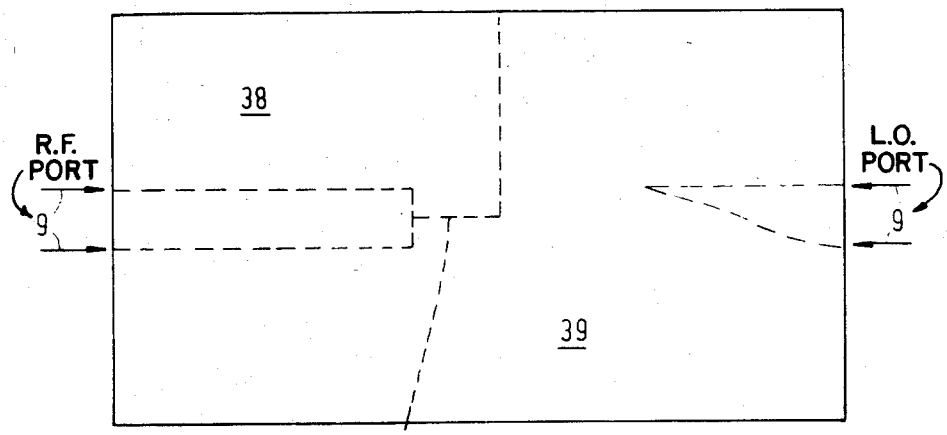

FIGS. 3A and 3B are schematic plan views of the whole substrate, viewed from the side of the mixer shown in FIG. 1 and in the direction of the arrow III in FIG. 2; the Figures show respectively the patterns of the conductive layers on the front and rear surfaces, the edges of the layers being denoted by continuous and broken lines respectively (for the time being disregarding in FIG. 3B the dashed line 37 which will be mentioned again later). The patterns intersect the planes of the upper and lower broad walls of the waveguide along horizontal lines (not drawn) extending between pairs of horizontally-opposed arrows 9 in the Figures. The conductive layer on the front surface is mainly confined to a region within and immediately adjacent the waveguide, while the conductive layer on the rear surface extends over the whole of that surface except for two regions in the waveguide.

It is necessary for certain portions of the conductive layer on the front surface of the substrate that extend in the waveguide, these portions being denoted A, B and C respectively, to be coupled to the waveguide housing at the frequencies of the R.F. and/or L.O. signals. To enhance this coupling and to inhibit the leakage of the R.F. and L.O. signals from the waveguide, the closed cavities formed by channels 5a, 5b and 6a, 6b above and below the waveguide respectively are dimensioned so that they are cut-off to all waveguide modes of propagation in the whole of the operating frequency range of the R.F. and L.O. signals and thus present an open-circuit to R.F. energy in this frequency range that might reach them. The portions A, B and C of the layer that are to be coupled to the housing extend between the housing members in engagement therewith up to the nearest wall of the respective closed cavity adjacent the waveguide, over a distance which is equal to a quarter of a wavelength in the substrate at the centre of the operating frequency range of the R.F. and L.O. signals, so that the open-circuit presented there by the respective closed cavity is transformed substantially to a short-circuit at the adjacent broad wall of the waveguide.

In this embodiment, portions B and C are D.C.-connected to the housing by conductive contact with the housing member 1, while portion A is separated from member 1 by a thin insulating layer (not shown), for example a film of Kapton (Trade Mark) 8 μm thick, so as to be isolated from the housing at D.C. but closely coupled therewith at the frequencies of the R.F. and L.O. signals. Except as mentioned later, the conductive layer on the rear surface of the substrate is in conductive contact with the housing member 2.

In order to inhibit resonant effects associated with the part of portion A that is engaged with the housing members and is D.C.-isolated from member 1 by the insulating layer, longitudinally-spaced transverse slots, of which a few are denoted 10, extend into the portion from the edge at the respective closed cavity almost up to the adjacent broad wall of the waveguide.

Other features which appear in FIGS. 3A and 3B will be described later.

Figure 4:
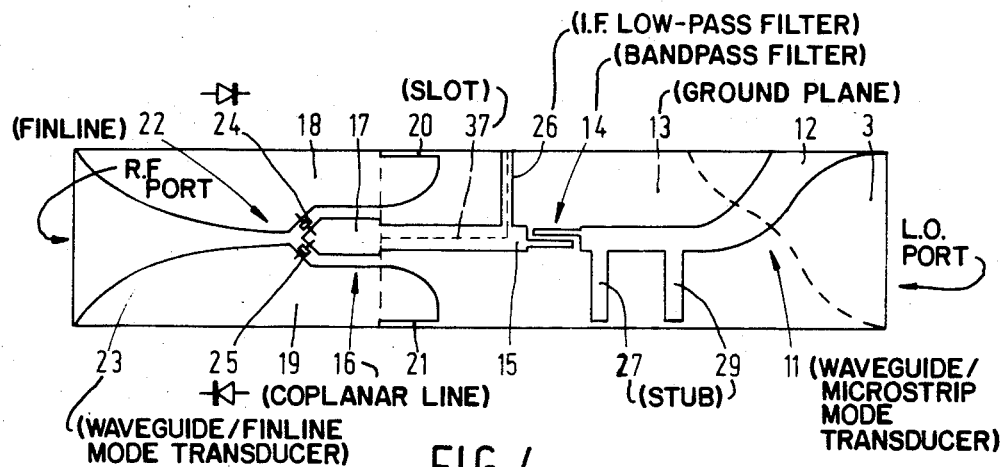
FIG. 4 is an enlarged plan view, not to scale, of the portion of the substrate that is situated in a waveguide cavity of the mixer.

FIG. 4 is an enlarged schematic view (not to scale) of the portion of the substrate that is disposed within the waveguide, again viewed from the side of the mixer shown in FIG. 1 and in the direction of the arrow III in FIG. 2. The uppermost and lowermost horizontal lines in the Figure indicate the intersection of the plane of the substrate with the planes of the upper and lower broad walls, respectively, of the waveguide. Considering the circuit from right to left (as drawn), the L.O. port of the mixer comprises a waveguide/microstrip mode transducer 11 comprising portions 12 and 13 of the conductive layers on the front and rear surfaces, respectively, of the substrate. These portions extend away from the upper and lower broad walls of the waveguide, and along the waveguide, progressively becoming transversely narrower and broader, respectively, to form a microstrip line strip conductor and its ground plane, respectively; the strip conductor extends along the center of the waveguide, and the ground plane extends across the whole height of the waveguide. The microstrip line is coupled by a band-pass filter 14 to a further length of microstrip line comprising a strip conductor 15 and the ground plane 13. The filter 14 comprises two adjacent transversely-spaced strips respectively connected to the strip conductor of the mode transducer 11 and to strip conductor 15.

At its end remote from the filter 14, the further length of microstrip line is coupled to a coplanar line (coplanar waveguide) 16 comprising a central conductor 17 separated by a circumferential gap from two transversely-opposed, outer ground conductors 18 and 19. The strip conductor 15 of the microstrip line is contiguous with the central conductor 17 of the coplanar line. The microstrip ground plane 13 on the rear surface of the substrate terminates, perpendicularly transverse to the waveguide, opposite the junction of strip conductor 15 and central conductor 17 on the front surface. The right-hand ends (as drawn) of the transversely-opposed ground conductors 18 and 19 on the front surface of the substrate overlap the microstrip ground plane 13 on the rear surface, tapering away fairly sharply as quadrant-like portions to the respective adjacent broad walls of the waveguide. Adjacent these walls, these portions of the conductors 18 and 19 are provided with respective longitudinal slots 20 and 21 to suppress spurious modes of propagation, the effective electrical length of each slot being a quarter of a wavelength at the frequency of the L.O. signal (or the centre of the L.O. signal frequency band if the mixer is designed for operation with L.O. signals of different frequencies).

As shown in FIGS. 3A and 4, the transversely-opposed ground conductors 18 and 19 also extend along the waveguide beyond the left-hand end (as drawn) of the coplanar line 16 to form successively a finline 22 and, as they taper away relatively gently to the respective broad walls of the waveguide, a finline/waveguide mode transducer 23 consituting the R.F. port of the mixer.

At the junction of the coplanar line 16 and the finline 22, two diodes 24 and 25 are connected in opposite respective electrical polarities (as indicated by the diode symbols adjacent their reference numbers) between the central conductor 17 of the coplanar line and the ground conductors 18 and 19. The length of the coplanar line 16 is a quarter of a wavelength at the centre of the R.F. signal frequency band so that the substantial short-circuit presented to the coplanar mode of propagation on the conductors 17, 18, 19 at the right-hand end of the coplanar line 16, where it is coupled to the microstrip line strip conductor 15, is transformed substantially to an open-circuit at the diodes 24 and 25 and therefore does not substantially affect the impedance presented at the diodes to a signal from the R.F. port. The diodes appear in series between the outer ground conductors 18 and 19.

The I.F. signal produced in the diodes 24 and 25 by the mixing of the R.F. and L.O. signals is extracted from the mixer via a microstrip low-pass filter 26 connected to strip conductor 15 at a T-junction adjacent band-pass filter 14. The low-pass filter 26 comprises a succession of five sections of line of alternately high and low impedances, each approximately a quarter of a wavelength long at the center of the operating frequency band of the R.F. and L.O. signals; of these sections, only the first, high impedance section is located in the waveguide and hence only this section appears in FIG. 4, while the whole filter appears in FIG. 3A. The end of the filter remote from strip conductor 15 constitutes the I.F. port of the mixer and is connected to coaxial connector 7.

As described in greater detail in our co-pending British Application No. 2,129,224A filed Aug. 27, 1982, to which the reader is referred and the entire contents of which are incorporated by reference herein, the mixer further comprises two short-circuited stubs 27 and 29 whose lengths and mutual spacing are each substantially a quarter wavelength at the L.O. frequency. The stubs have substantially no effect at the L.O. frequency but substantially short-circuit the mode transducer 11 at the intermediate frequency and thereby inhibit the mode transducer from acting as a stub weakly coupled to the rest of the mixer circuit at the intermediate frequency.

As described in greater detail in our co-pending U.S. application No. 521,492 filed Aug. 8, 1983, to which the reader is referred and the entire contents of which are incorporated by reference herein, the mixer comprises conductive connection means extending through the substrate from each of the conductors 18 and 19 to the ground plane 13. This can reduce the impedance in the ground return path for the I.F. signals between the diodes and the ground plane 13 and can thereby improve performance.

Figure 5:
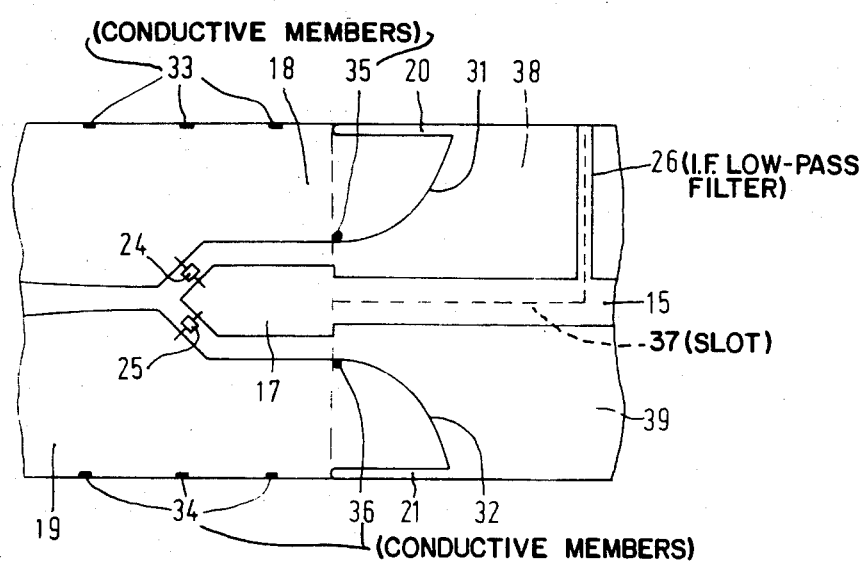
FIG. 5 is a further enlarged plan view, not to scale, of part of the portion of the substrate shown in FIG. 4.

It is desirable to D.C.-bias the diodes in operation, especially if they have a relatively large barrier height, being for example Gallium Arsenide devices; a particular value of conversion loss obtainable without D.C. bias will become obtainable at a smaller L.O. signal power with D.C. bias. This may be especially significant when the local oscillator operates in the millimeter wavelength range (since currently-available oscillators for this range tend to have only a restricted power output) and/or when it may be desirable to supply a plurality of mixer circuits from a single local oscillator. The inclusion of the conductive connection means in the mixer circuit as so far described would prevent the application of D.C. bias to the diodes 24 and 25, since both diodes would be D.C.-connected to the ground plane 13 and a direct voltage could therefore not be applied across the diodes in series. In order to enable D.C. bias to be applied, the mixer circuit includes slot means 37 in the ground plane 13 to mutually D.C.-isolate two portions 38 and 39 of the ground plane to which the diodes 24 and 25 are respectively D.C.-connected. The slot means is formed by a single continuous gap or slot some 20 μm wide, formed in the conductive layer on the rear surface of the substrate with a laser. The disposition of the slot is indicated schematically in FIGS. 3B, 4 and 5 by a single line of short dashes; the slot is juxtaposed with the strip conductor 15 and with the pattern of the low-pass filter 26 on the front surface of the substrate, in this embodiment extending centrally therebeneath. The portion 38 of the ground plane, to which the diode 24 is connected and which in the drawing figures lies above and to the left of the slot means 37, is D.C.-isolated from the adjacent housing member 2 and thus from the housing as a whole by an insulating layer (not shown), for example a layer of Kapton (Trade Mark) 8 μm thick extending between portion 38 and member 2 where they overlap and engage one another; this portion 38 is connected to a source of the bias voltage at connector 8. The other portion 39 of the ground plane, to which the diode 25 is connected and which in the drawing figures lies below and to the right of the slot means 37, is in conductive contact with the housing member 2. Concomitantly, only the latter portion 39 is directly connected to the ground portion of coaxial connector 7 at which the I.F. signal is extracted from the mixer. The two portions are mutually coupled at R.F., in particular by capacitive coupling via the conductive material of the housing; in addition, there may be coupling across the narrow width of the slot along its length, which in this embodiment is some 5 wavelengths at the centre of the operating frequency range of the R.F. and L.O. signals. As indicated in FIG. 3B, a large percentage of the portion 38 extends outside the waveguide and immediately adjacent the housing member 2, being separated therefrom by the insulating layer; the portion is thus capacitively coupled to the conductive material over the majority of the portion. The mutual coupling of the two portions is distributed, as opposed to the lumped or localized coupling between the bias pad and the adjacent ground plane region in the above-mentioned U.S. Pat. No. 3,939,430.

As mentioned above, of the two portions of ground plane only the portion 39, to which the diode 25 is connected, is directly connected to the ground portion of coaxial connector 7 at which the I.F. signal is extracted from the mixer. For I.F. signals in the microwave frequency band, the ground return path from diode 24 to connector 7 can rely on the mutual coupling of the two portions of ground plane. At lower frequencies (if the I.F. band is to include such frequencies), an I.F. signal ground return path of adequately low impedance can be obtained with a capacitor connected between the bias supply and ground, for example outside the waveguide but inside the housing, e.g. in a recess therein.

As explained above, the secondary transmission line formed by the slot means has a much lower characteristic impedance than the primary transmission lines of the R.F. circuit. The small width of the slot forming this secondary line will (as also explained above) result in the secondary line having a substantial attentuation in the frequency band of the R.F. and L.O. signals, especially if this frequency band is very high, e.g. 60-90 GHz. Thus although the secondary line may not be terminated in a matched manner, being terminated in this embodiment by a high impedance (virtually an open-circuit) at each end, any small amount of R.F.

energy which is coupled out of the main R.F. circuit into the slot will generally be significantly attenuated before being reflected at a non-matched termination of the slot, and will be further attenuated after reflection. Consequently, the secondary line formed by the slot will generally exhibit a high return loss. Thus:

(a) The impedance presented by the slot means to the transmission lines of the R.F. circuit at any point where any of those lines and the slot means are adjacent will generally approximate the characteristic impedance of the secondary transmission line formed by the slot means. As this is much less than the local characteristic impedances of the adjacent primary transmission lines of the R.F. circuit, there will be a large mis-match which will inhibit the coupling of R.F. energy therebetween.

(b) The amount of energy that is available to be coupled back into the R.F. circuit from the slot means will be very small. Therefore, not only will little energy be lost from the R.F. circuit by coupling into the slot means, but there will be little disturbance of the operation of the circuit from energy coupled out of the circuit into the slot means and back into the circuit.

The impedance mis-match between a transmission line of the main R.F. circuit and the transmission line formed by the slot means is particularly marked at the region where the conductors 18 and 19 on the front surface of the substrate (and possibly also similarly-shaped conductors on the rear surface), along which energy may propagate away from the R.F. port of the mixer in a finline mode, adjoin the slot means at the edge of the ground plane 13 opposite the junction of conductors 15 and 17.

It will be seen that the slot means extend transversely across the transmission path of the L.O. signal between the L.O. signal port and the diodes only at the T-junction in strip conductor 15 where the I.F. output filter 26 is connected. This transverse portion of slot will have little effect on the L.O. signal owing to the mutual R.F. coupling of the two portions of the ground plane and to the fact that any reflections produced at the opposite edges of this transverse portion of slot will almost completely cancel one another because of the very small longitudinal spacing between the opposite edges.

The symmetrical positioning, in the above-described embodiment, of the slot means 37 with respect to the diodes 24 and 25 and to the strip conductor 15 of the microstrip line to which the diodes are conductively connected has the advantage of alleviating a potential cause of imbalance in the mixer. Nevertheless, it is not essential to use this positioning, and the slot means 37 could be located elsewhere. The slot means could extend from the edge of the ground plane anywhere in the vicinity of the coplanar line in such a manner as to mutually D.C.-isolate the portions of the ground plane to which the diodes are respectively connected, i.e. to the right of the diodes in FIGS. 4 and 5. For example, a slot could extend along an upward extrapolation of the vertical edge (juxtaposed with the junction of the strip conductors 15 and 17) of the ground plane in the waveguide.

Although the embodiments described above with reference to the drawing use a single insulating sheet as the substrate means, the latter may comprise a plurality of insulating sheets, for example as described in the paper "A 26.5-to-40 GHz Planar Balanced Mixer" by U. H. Gysel, Proc. 5th European Microwave Conference, September, 1975, pp 491–495, and in U.S. Pat. No. 4 032 849.

An R.F. mixer circuit embodying the invention may also be used as a frequency up-converter, input signals of suitable frequencies being supplied to the two ports designated the L.O. and I.F. ports in the previously described embodiment, and an output signal of higher frequency than each input signal being derived from the port designated the R.F. port.

We claim:

1. An R.F. circuit arrangement comprising an insulative substrate, at least one R.F. strip-type transmission line including a strip conductor and a ground plane conductor disposed on the substrate, and first and second diodes each electrically-connected between the strip conductor and a respective one of first and second portions of the ground plane conductor, said circuit arrangement including coupling means for D.C.-isolating and R.F.-coupling said first and second portions, comprising:
   (a) a slot in the ground plane conductor for D.C. isolating the first and second portions thereof, said slot being sufficiently narrow to inhibit the coupling of R.F. energy into the slot;
   (b) a housing comprising first and second conductive portions adjacent to the first and second portions of the ground plane conductor; and
   (c) an insulative layer disposed between at least said first housing portion and said first ground plane portion;

said housing and said insulative layer effecting said R.F. coupling of the first and second portions of the ground plane conductor.

2. An R.F. circuit arrangement as in claim 1 where the second conductive portion of the housing is in contact with the second portion of the ground plane conductor.

3. An R.F. circuit arrangement as in claim 1 or 2 where the slot has a portion adjacent to the strip-type transmission line, said slot portion presenting an impedance which differs greatly from the local characteristic impedance of said transmission line.

4. An R.F. circuit arrangement as in claim 3 where the impedance presented by the slot is much smaller than the local characteristic impedance of the transmission line.

5. An R.F. circuit arrangement as in claim 1 or 2 where the strip conductor is on a first side of the substrate, where the ground plane conductor is on an opposite side of the substrate, and where the slot includes a portion juxtaposed with the strip conductor.

6. An R.F. circuit arrangement as in claim 5 where said juxtaposed portion of the slot is disposed alongside a central longitudinal axis of said strip conductor.

* * * * *